United States Patent
Liao et al.

(10) Patent No.: US 8,787,109 B2
(45) Date of Patent: Jul. 22, 2014

(54) WORD LINE DRIVER HAVING A CONTROL SWITCH

(75) Inventors: Wei-Li Liao, Taichung (TW);
Sung-Chieh Lin, Zhubei (TW);
Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 107 days.

(21) Appl. No.: 13/466,518

(22) Filed: May 8, 2012

(65) Prior Publication Data
US 2013/0301374 A1    Nov. 14, 2013

(51) Int. Cl.
*G11C 8/00* (2006.01)
*G11C 5/14* (2006.01)
*G11C 16/06* (2006.01)

(52) U.S. Cl.
USPC ............. 365/230.06; 365/189.09; 365/185.23

(58) Field of Classification Search
USPC ................................................... 365/230.06
See application file for complete search history.

(56) References Cited

U.S. PATENT DOCUMENTS

| | | | | | |
|---|---|---|---|---|---|
| 5,602,796 | A | * | 2/1997 | Sugio ....................... | 365/230.06 |
| 5,822,253 | A | * | 10/1998 | Lines ....................... | 365/189.11 |
| 6,044,020 | A | * | 3/2000 | Chung et al. ............. | 365/185.23 |
| 6,166,957 | A | * | 12/2000 | Chung et al. ............. | 365/185.23 |
| 6,370,063 | B2 | * | 4/2002 | Kim ......................... | 365/185.23 |
| 6,774,673 | B2 | * | 8/2004 | Tsuboi et al. .................. | 326/68 |
| 7,463,545 | B2 | * | 12/2008 | Kumala .................... | 365/230.06 |
| 7,710,796 | B2 | * | 5/2010 | Cottier et al. ............ | 365/189.11 |
| 7,834,662 | B2 | * | 11/2010 | Campbell et al. ............... | 326/68 |
| 8,427,888 | B2 | * | 4/2013 | Lu et al. ................... | 365/189.11 |

* cited by examiner

*Primary Examiner* — Son Mai
(74) *Attorney, Agent, or Firm* — Lowe Hauptman & Ham, LLP

(57) ABSTRACT

A word line driver including a control switch configured to receive a control signal, where the control switch is between a first node configured to receive an operating voltage signal and a second node configured to determine an output of the word line driver. The word line driver further includes a cross-coupled amplifier electrically connected to the second node. The word line driver further includes at least one inverter electrically connected to the cross-coupled amplifier. A semiconductor device including the word line driver and a memory array including at least one electronic fuse.

21 Claims, 4 Drawing Sheets

WORD LINE DRIVER HAVING A CONTROL SWITCH

BACKGROUND

Word line drivers are configured to generate a word line signal carried by a word line which is received by memory cells of a memory array. The word line signal activates portions of the memory array to facilitate reading data from or programming data to the memory cells in the activated portions. In an existing approach, a logic level of the word line signal is determined using a first transistor and a second transistor. The first transistor is between the word line and an operating voltage. The second transistor is between the word line and a reference voltage. A gate of the first transistor is coupled to the operating voltage.

By coupling the gate of the first transistor to the operating voltage, the word line signal is susceptible to errors due to electrostatic discharge (ESD). During an ESD event, the operating voltage suddenly increases. In some instances, the first transistor allows the increased operating voltage to generate the word line signal. As a result, in some instances, the activated portions of the memory cell are erroneously programmed.

Erroneous programming is also a concern during a power on operation. In some instances, the word line driver receives a first operating voltage and a second operating voltage, where a voltage level of the first operating voltage is different than a voltage level of the second operating voltage. In instances where the first operating voltage is connected to the gate of the first transistor and fully powers on before the second operating voltage, the first transistor allows the first operating voltage to generate the word line signal. In such instances, the first operating voltage erroneously programs the activated portions of the memory array.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are not intended to be limiting examples.

Figure 1:
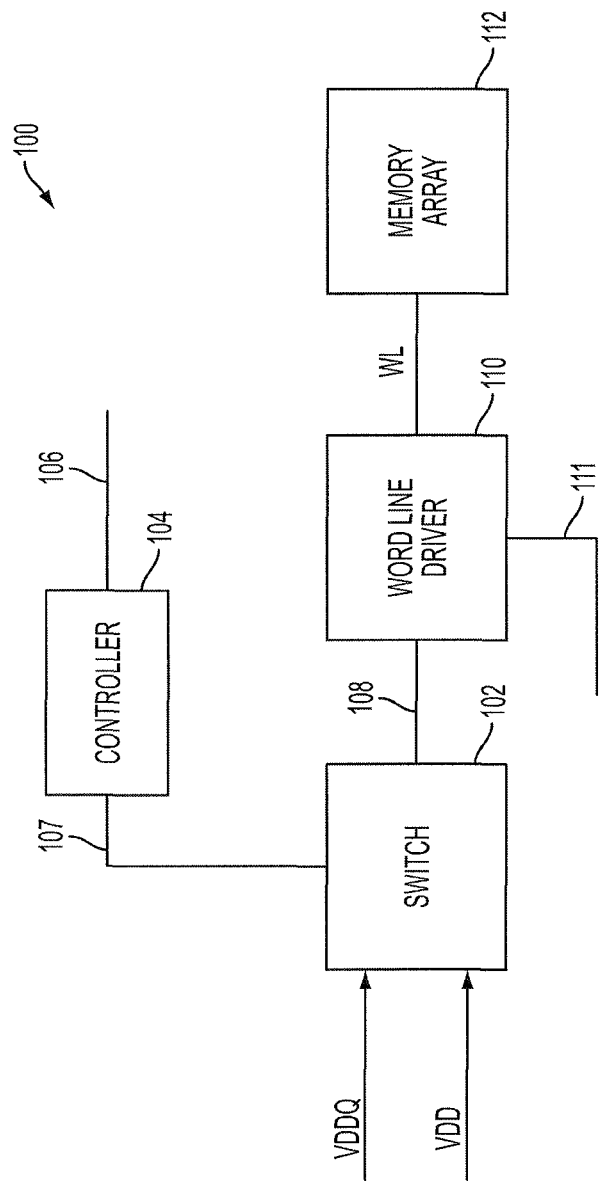
FIG. 1 is a block diagram of a semiconductor device including a word line driver according to one or more embodiments.

FIG. 1 is a block diagram of a semiconductor device 100 according to one or more embodiments. Semiconductor device 100 includes a switch 102 which is connected to a controller 104. Switch 102 is also connected to a word line driver 110. Word line driver 110 is connected to a memory array 112 by a word line carrying a word line signal WL.

Switch 102 is configured to receive a first operating voltage VDDQ and a second operating voltage VDD. Controller 104 is configured to receive a read/write signal 106 and output a selector signal 107. Switch 102 is configured to output an operating voltage signal 108 based on selector signal 107. Operating voltage signal 108 is equal to either the first operating voltage VDDQ or the second operating voltage VDD depending on a logical level of selector signal 107.

Word line driver 110 is configured to receive operating voltage signal 108 and a decoder signal 111. Word line driver 110 is configured to output word line signal WL based on operating voltage signal 108 and decoder signal 111. Memory array 112 is configured to receive word line signal WL, and a portion of memory array 112 is activated based on word line signal WL.

Switch 102 is configured to receive first operating voltage VDDQ and second operating voltage VDD. In some embodiments, first operating voltage VDDQ has a higher voltage level than second operating voltage VDD. In some embodiments, the voltage level of first operating voltage VDDQ ranges from 1.6 V to 2.0 V. In some embodiments, the voltage level of second operating voltage VDD ranges from 0.65 V to 1.0 V. In operation, if the logical level of selector signal 107 corresponds to word line driver 110 operating in a read mode, switch 102 outputs operating voltage signal 108 equal to second operating voltage VDD. If the logical level of selector signal 107 corresponds to word line driver 110 operating in a write mode, switch 102 output operating voltage signal equal to first operating voltage VDDQ. In some embodiments, switch 102 comprises a transistor, a mechanical switch, a thyristor, or a microelectromechanical system (MEMS) device or other suitable devices.

Controller 104 is configured to receive read/write signal 106 and output selector signal 107. In some embodiments, read/write signal 106 is generated by a processor. In some embodiments, read/write signal 106 is generated based on a user input. In some embodiments, controller 104 comprises a processor or a switch.

Figure 2:
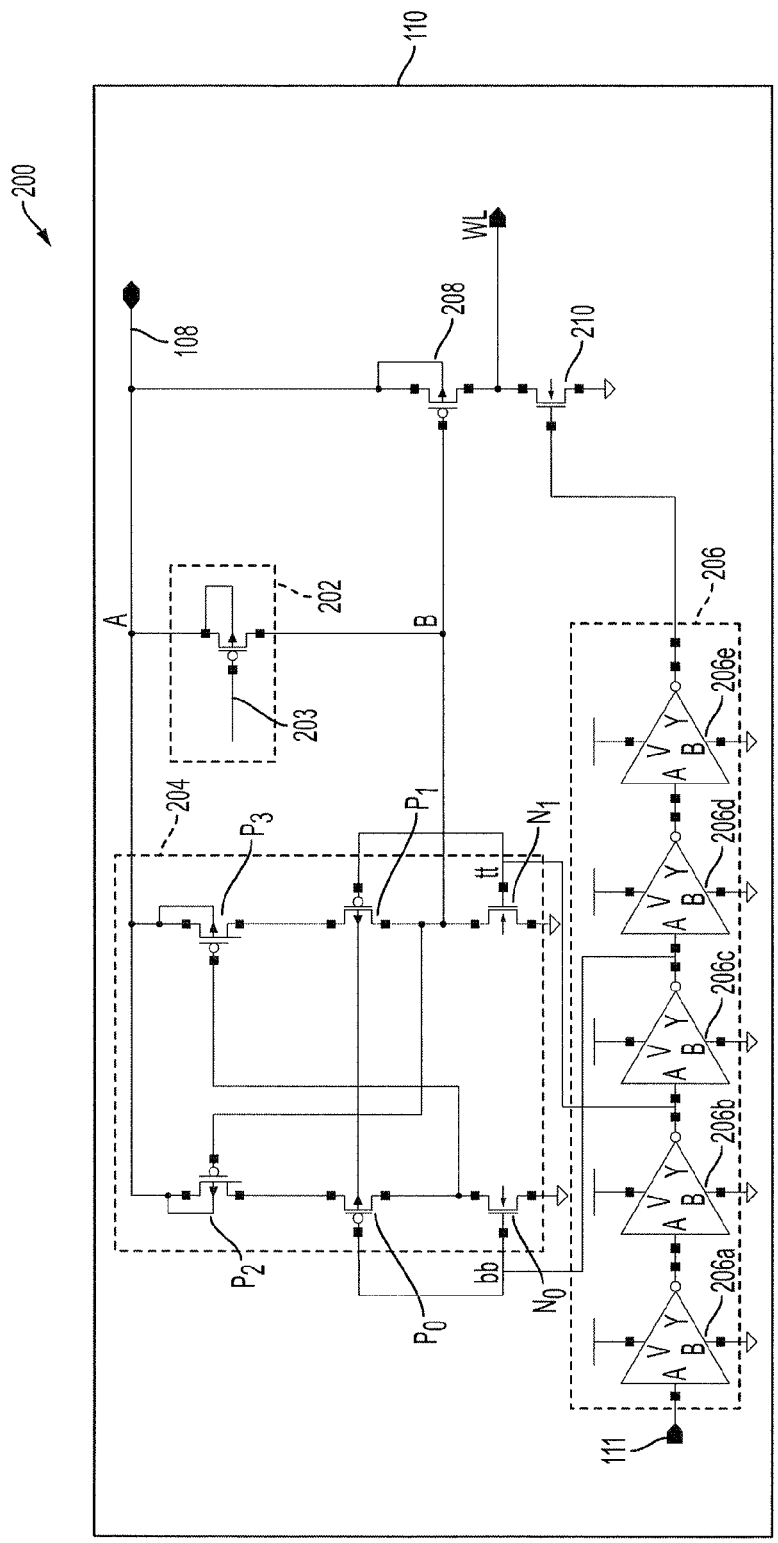
FIG. 2 is a schematic diagram of a word line driver according to one or more embodiments.

Word line driver 110 is configured to output word line signal WL based on a received operating voltage signal 108 and decoder signal 111. FIG. 2 is a schematic diagram of a word line driver 200, such as word line driver 110, according to one or more embodiments.

Word line driver 200 includes a control switch 202 connected to a cross-coupled amplifier 204. A series of inverters 206 is connected to cross-coupled amplifier 204. Control switch 202 is connected to a gate of a first transistor 208. Series of inverters 206 are connected to a gate of a second transistor 210.

Control switch 202 is between a node A and a node B. Control switch 202 is a p-type metal-oxide-semiconductor (PMOS) transistor having a source electrically connected to first node A and a drain connected to second node B. A gate of control switch 202 is configured to receive control signal 203. In some embodiments, control switch 202 is a different type of transistor. In some embodiments, control switch 202 is a mechanical switch, a thyristor or other suitable devices. A voltage at node A is equal to the operating voltage signal 108. Node B is connected to the gate of first transistor 208. In operation, control switch 202 electrically connects or disconnects node A from node B based upon the received control signal 203.

In some embodiments, control signal 203 is generated by an external logic device, such as controller 104, based on whether word line driver 200 is in a read mode or a write mode. In operation, if word line driver 200 is in the read mode, control switch 202 electrically disconnects first node A from second node B based on control signal 203 being equal to first operating voltage VDDQ. If word line driver 200 is in the write mode, control switch 202 electrically connects first node A to second node B based on control signal 203 being equal to a reference voltage, which, in some embodiments, is ground.

Cross-coupled amplifier 204 includes PMOS transistors P0, P1, P2 and P3 and n-type metal-oxide-semiconductor (NMOS) transistors N0 and N1. The transistor arrangement of cross-coupled amplifier 204 is an example and not intended to be limiting. In some embodiments, cross-coupled amplifier 204 includes a different number of transistors. In some embodiments, cross-coupled amplifier 204 includes transistors having different dopant types. In some embodiments, NMOS transistors N0 and N1 are configured to be level shifting circuitry. Level shifting circuitry is configured to facilitate a change in logic level at node B depending on whether word line driver 110 is in a write mode or a read mode. In some embodiments, cross-coupled amplifier 204 includes different types of level shifting circuitry.

Cross-coupled amplifier 204 is configured to receive operating voltage signal 108, the reference voltage and voltages tt and bb from series of inverters 206. Cross-coupled amplifier 204 is also connected to node B.

A source of NMOS transistor N0 is configured to receive the reference voltage, a drain of NMOS transistor N0 is electrically connected to a drain of PMOS transistor P0 and a gate of PMOS transistor P3. A gate of NMOS transistor N0 is electrically connected to a gate of PMOS transistor P0 and is configured to receive voltage bb from series of inverters 206.

A source of NMOS transistor N1 is configured to receive the reference voltage, a drain of NMOS transistor N1 is electrically connected to a drain of PMOS transistor P1 and a gate of PMOS transistor P2. A gate of NMOS transistor N1 is electrically connected to a gate of PMOS transistor P1 and is configured to receive voltage tt from series of inverters 206.

A source of PMOS transistor P2 is configured to receive operating voltage signal 108 and a drain of PMOS transistor P2 is electrically connected to a source of PMOS transistor P0. A source of PMOS transistor P3 is configured to receive operating voltage signal 108 and a drain of PMOS transistor P3 is electrically connected to a source of PMOS transistor P1.

In operation, cross-coupled amplifier 204 is configured to control the voltage level at second node B based on decoder signal 111. If decoder signal 111 has a low logical level, cross-coupled amplifier 204 maintains the voltage level at second node B by deactivating NMOS N1 to prevent the voltage level at second node B from being pulled down to the reference voltage at the source of transistor N1. If decoder signal 111 has a high logical level, cross-coupled amplifier 204 activates NMOS transistor N1, which pulls the voltage level at second node B to the reference voltage at the source of NMOS transistor N1.

Series of inverters 206 includes five inverters 206a-206e. In some embodiments, series of inverters 206 includes more or less than five inverters. In some embodiments, series of inverters 206 includes two inverters. Series of inverters 206 is connected to cross-coupled amplifier 204. Series of inverters 206 is configured to output voltages tt and bb to cross-coupled amplifier 204. Series of inverters 206 is configured to receive decoder signal 111 and control second transistor 210 based on decoder signal 111. Series of inverters 206 are configured to increase the speed of switching of second transistor 210 in comparison with arrangements which do not include series of inverters 206. The transistor arrangement of series of inverters 206 is an example and not intended to be limiting.

A voltage tt between inverter 206b and inverter 206c is transmitted to the gates of NMOS transistor N1 and PMOS transistor P1. A voltage bb between inverter 206c and inverter 206d is transmitted to the gates of NMOS transistor N0 and PMOS transistor P0. In operation, if decoder signal 111 has a low logical level, voltage tt has a low logical level and NMOS transistor N1 is turned off to prevent the voltage level at second node B from being pulled down to the reference voltage at the source of NMOS transistor N1. Also if decoder signal 111 has a low logical level, voltage bb has a high logical level and NMOS transistor N0 is turned on pulling a voltage level at the drain of NMOS transistor N0 to the reference voltage at the source of transistor N0. The reference voltage at the drain of NMOS transistor N0 is connected to the gate of PMOS transistor P3 which turns on PMOS transistor P3 allowing operating voltage signal 108 to supply the voltage level at second node B.

If decoder signal 111 has a high logical level, voltage tt has a high logical level and NMOS transistor N1 is turned on to pull the voltage level at second node B to the reference voltage at the source of transistor N1. If decoder signal 111 has a high logical level, voltage bb has a low logical level and NMOS transistor N0 is turned off which prevents the voltage level at the drain of NMOS transistor N0 from being pulled to the reference voltage at the source of transistor N0, thereby maintaining a high logic state at the drain of NMOS transistor N0. The high logic state at the drain of NMOS transistor N0 is connected to the gate of PMOS transistor P3 which turns off PMOS transistor P3 preventing operating voltage signal 108 from supplying the voltage level at second node B.

First transistor 208 is a PMOS transistor. In some embodiments, first transistor 208 is a different type of transistor. In some embodiments, first transistor 208 is a mechanical switch, a thyristor or other suitable device. The gate of first transistor 208 is electrically connected to second node B. First transistor 208 is configured to receive operating voltage signal 108 at the source of first transistor 208, and to output word line signal WL at the drain of first transistor 208. In operation, if node B has a logically low voltage level, first transistor 208 is turned on and operating voltage signal 108 passes through first transistor 208 to be output as word line signal WL. If node B has a logically high voltage level, first transistor 208 is turned off and prevents operating voltage signal 108 from being output as word line signal WL.

Second transistor 210 is an NMOS transistor. In some embodiments, second transistor 210 is a different type of transistor. In some embodiments, second transistor 210 is a mechanical switch, a thyristor or another suitable device. A gate of second transistor 210 is electrically connected to series of inverters 206. Second transistor 210 is configured to receive the reference voltage at the source of second transistor 210 and to output word line signal WL at the drain of second transistor 210. In operation, if series of inverters 206 outputs a logically high voltage level, second transistor 210 is turned on and the reference voltage at the source of second transistor 210 pulls word line signal WL to the reference voltage. If series of inverters 206 outputs a logically low voltage level, second transistor 210 is turned off and prevents the reference voltage from pulling word line signal WL to the reference voltage.

In overall operation, if decoder signal 111 is logically low, word line signal WL is logically low. If decoder signal 111 is logically high, word line signal WL is equal to operating voltage signal 108. If word line driver 110 is in read mode, operating voltage signal 108 is equal to second operating voltage VDD. If word line driver 110 is in write mode, operating voltage signal 108 is equal to first operating voltage VDDQ.

Returning to FIG. 1, memory array 112 is coupled to word line driver 110 and configured to receive word line signal WL. Memory array 112 includes at least one memory cell configured to store data. Memory array 112 is configured to supply data to external circuitry during read mode and receive and store data during write mode. In some embodiments, the memory cell includes at least one electronic fuse (eFuse) configured to store data. The eFuse is programmed by applying a high voltage level, such as first operating voltage VDDQ, to the eFuse. In operation, if word line signal WL is equal to first operating voltage VDDQ, information is stored in the at least one memory cell of memory array 112. If word line signal WL is equal to second operating voltage VDD, information is read from memory array 112. If word line signal WL is equal to the reference voltage, corresponding memory cells in memory array 112 are not activated.

In comparison with word line drivers which permanently couple first node A and second node B, word line driver 200 provides increased protection from erroneous programming during an electrostatic discharge (ESD) event. By supplying control signal 203 to control switch 202, word line driver 200 is capable of maintaining the voltage level at second node B at a level sufficient to maintain first transistor 208 in an "off" state regardless of an ESD event because a voltage level of control signal 203 is sufficiently high to prevent erroneous activation of control switch 202. By using control signal 203, information stored in memory array 112 has increased accuracy resulting in improved functionality of circuitry using the information stored in memory array 112.

Figure 3:
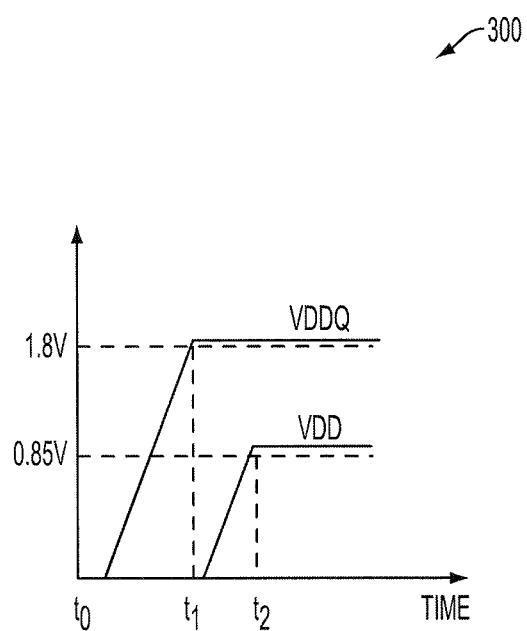
FIG. 3 is a graph of voltage versus time during a power on operation according to one or more embodiments.

Word line driver 200 also reduces the risk of erroneous programming during a power on operation in comparison with word line drivers which permanently couple first node A and second node B. FIG. 3 is a graph of voltage levels versus time during a power on operation. Time extends along the abscissa and voltage is along the ordinate. Line VDDQ represents a voltage level of first operating voltage VDDQ. Line VDD represents a voltage level of second operating voltage VDD. The power on operation begins at time T0. At time T1, first operating voltage VDDQ reaches a stable level. At time T2, after time T1, second operating voltage VDD reaches a stable level. Because second operating voltage VDD is not fully powered, i.e., floating, at the time first operating voltage VDDQ reaches the stable level, the voltage level at the gates of NMOS transistors N0 and N1 is uncertain. If NMOS transistor N1 is in an "on" state, word line signal WL equals operating voltage signal 108 thereby increasing the risk of erroneous programming within memory array 112. By supplying control signal 203 to control switch 202, word line driver 200 is capable of maintaining the voltage level at second node B at a level sufficient to maintain first transistor 208 in the "off" state because a voltage level of control signal 203 is sufficiently high to prevent erroneous activation of control switch 202. By using control signal 203, information stored in memory array 112 has increased accuracy resulting in improved functionality of circuitry using the information stored in memory array 112.

Additionally, by using control switch 202 coupled to control signal 203, sizes of elements within word line driver 200 are reduced in comparison with word line drivers which permanently couple first node A and second node B. The sizes of the elements within word line driver 200 are reduced because control switch 202 reduces leakage reduction constraints on other elements within word line driver 200. Due to control signal 203 preventing erroneous activation of control switch 202, the other elements of word line driver 200 are not required to assist in avoiding erroneous programming within memory array 112.

With advanced technologies having decreased node sizes, leakage at switching elements disposed at a location similar to control switch 202 increases. In response, a previous approach involved increasing a size of the switching elements to reduce leakage. For example, at a scale of 20 nm semiconductor processing, the switching elements in the previous approach have a gate width equal to 0.36 microns and a gate length equal to 1.8 microns. In contrast, in some embodiments, control switch 202 has a gate width ranging from 0.26 microns to 0.35 microns and a gate length ranging from 0.13 microns to 0.17 microns. The reduction in gate width is up to 28% and the reduction in gate length is up to 92%.

Further, a size of NMOS transistors N0 and N1 is reduced in comparison with word line drivers which permanently couple first node A and second node B. For example, at the scale of 20 nm semiconductor processing, conventional NMOS transistors have a gate width equal to 6.8 microns and a gate length equal to 0.036 microns. In contrast, NMOS transistors N0 and N1 have a gate width ranging from 3.7 microns to 4.5 microns and a gate length ranging from 0.030 microns to 0.037 microns. The reduction in gate width is up to 46% and the reduction in gate length is up to 17%. By decreasing the size of NMOS transistors N0 and N1, an overall size of cross-coupled amplifier 204 is reduced by approximately 17% in comparison with cross-coupled amplifier comprising conventional NMOS transistors.

Figure 4:
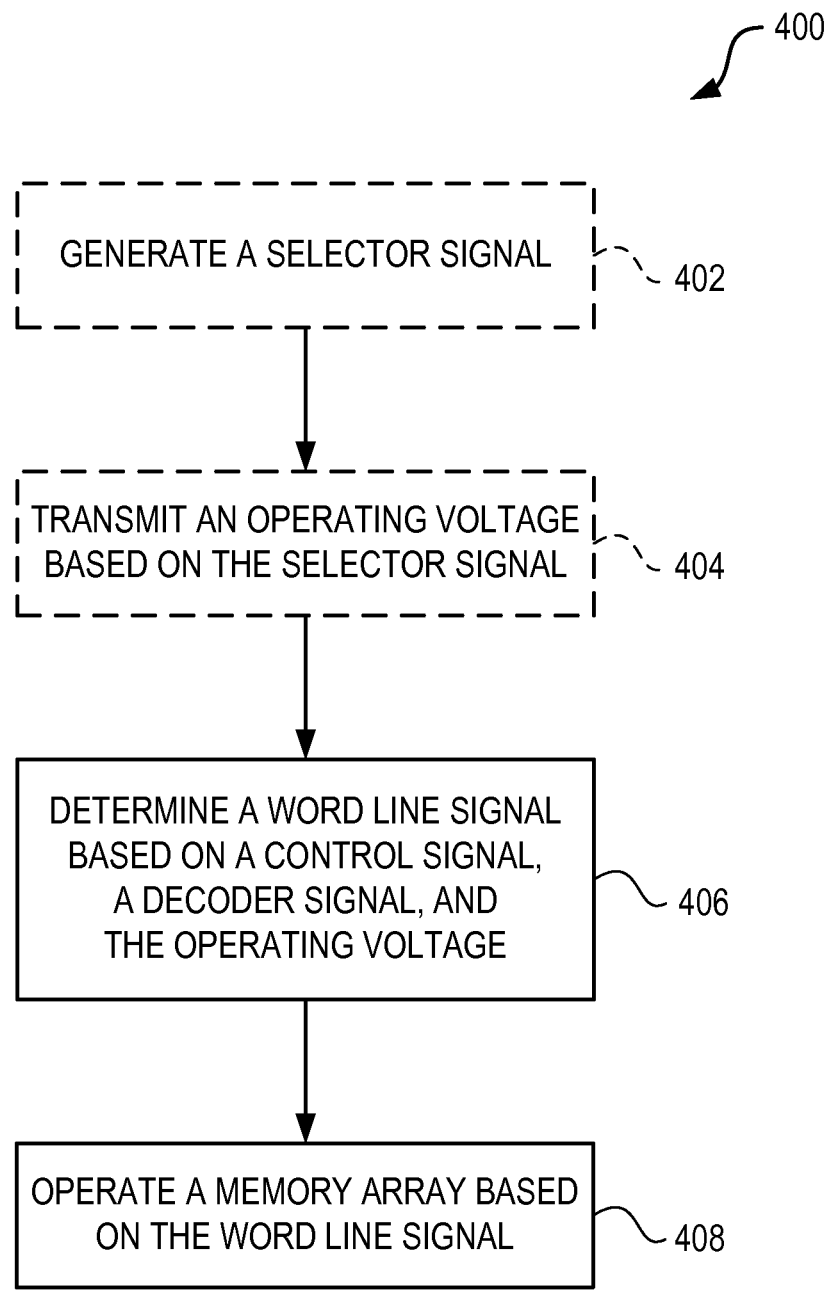
FIG. 4 is a flowchart of a method of reading data from, writing data to a memory array according to one or more embodiments.

FIG. 4 is a flowchart of a method 400 of reading data from, or writing data to a memory array. Method 400 begins with operation 402, in which a selector signal is generated. The selector signal indicates whether data is being read from or written to the memory array. In the embodiment of FIG. 1, controller 104 generates selector signal 107. In some embodiments, the selector signal is generated based on a user input. In some embodiments, the selector signal is generated by a controller configured to receive instructions from the user or from external circuitry.

Method 400 continues with optional operation 404, in which an operating voltage is transmitted based on the selector signal. A voltage level of the operating voltage is determined based on whether the selector signal indicates a read mode or a write mode. In the embodiment of FIG. 1, switch 102 is configured to transmit operating voltage 108 based on selector signal 107.

In operation 406, a word line signal is determined based on the operating voltage, a control signal and a decoder signal. In the embodiment of FIG. 2, word line driver 200 determines word line signal WL based on operating voltage 108, decoder signal 111 and control signal 203. Further, control signal 203 selectively activates control switch 202. If control switch 202 is activated, the second node B is connected to operating voltage 108. If decoder signal 111 indicates a read mode, cross-coupled amplifier 204 maintains the voltage level at second node B equal to operating voltage 108 by disconnecting second node B from the reference voltage. If decoder signal 111 indicates a write mode, cross-coupled amplifier 204 pulls the voltage level at second node B to the reference voltage by connecting second node B to the reference voltage at the source of NMOS transistor N1. Second node B is connected to the gate of first transistor 208, so the voltage level at second node B determines whether first transistor 208 is activated, and if so, word line signal WL equals operating voltage 108. Series of inverters 206 is connected to the gate of second transistor 210, so the voltage level of the output of series of inverters 206 determines whether second transistor 210 is activated, and if so, word line signal WL equal the reference voltage at the source of transistor 210.

In operation 408, a memory array is operated based on the word line signal. In the embodiment of FIG. 1, memory array 112 receives word line signal WL. Based on the voltage level of word line signal WL, memory array 112 either reads out data stored in memory array 112 or memory array 112 is programmed to store data.

One aspect of the present description relates to a word line driver including a control switch configured to receive a control signal, where the control switch is disposed between a first node configured to receive an operating voltage signal and a second node configured to determine an output of the word line driver. The word line driver further includes a cross-coupled amplifier electrically connected to the second node. The word line driver further includes at least one inverter electrically connected to the cross-coupled amplifier.

Another aspect of the present description relates to a semiconductor device including a word line driver. The word line driver includes a control switch configured to receive a control signal, wherein the control switch is disposed between a first node configured to receive an operating voltage signal and a second node configured to determine an output of the word line driver. The word line driver further includes a cross-coupled amplifier electrically connected to the second node. The word line driver further includes at least one inverter electrically connected to the cross-coupled amplifier. The word line driver is configured to generate a word line signal. The semiconductor device further includes a memory array configured to receive the word line signal. The memory array includes at least one electronic fuse (eFuse) configured to be programmed based on the word line signal It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A word line driver comprising:
   a control switch configured to receive a control signal, wherein the control switch is between a first node configured to receive an operating voltage signal and a second node;
   a cross-coupled amplifier electrically connected to the second node, the cross-coupled amplifier being configured to generate a node voltage at the second node responsive to an input signal, regardless of a voltage level of the control signal; and
   at least one inverter electrically connected to the cross-coupled amplifier and configured to receive the input signal.

2. The word line driver of claim 1, further comprising:
   a first transistor comprising:
      a source configured to receive the operating voltage signal;
      a drain electrically connected to an output of the word line driver; and
      a gate electrically connected to the second node; and
   a second transistor comprising:
      a source configured to receive a reference voltage;
      a drain electrically connected to the output of the word line driver; and
      a gate electrically connected to the at least one inverter.

3. The word line driver of claim 1, wherein the control switch is a p-type metal-oxide-semiconductor (PMOS) transistor.

4. The word line driver of claim 3, wherein a gate width of the control switch ranges from 0.26 microns to 0.35 microns.

5. The word line driver of claim 3, wherein a gate length of the control switch ranges from 0.13 microns to 0.17 microns.

6. The word line driver of claim 1, wherein the cross-coupled amplifier comprises:
   a first n-type metal-oxide-semiconductor (NMOS) transistor; and
   a second NMOS transistor,
   wherein a gate width of the first and second NMOS transistors ranges from 3.7 microns to 4.5 microns.

7. The word line driver of claim 1, wherein
   if the operating voltage signal has a first voltage level the word line driver is in a write mode, and
   if the operating voltage signal has a second voltage level less than the first voltage level the word line driver is in a read mode.

8. A semiconductor device comprising:
   a word line driver comprising:
      a control switch coupled between a first node and a second node, the control switch being configured to receive an operating voltage signal at the first node;
      a cross-coupled amplifier having an input node and an output node, the output node being electrically connected to the control switch at the second node;
      at least one inverter electrically connected to the input node of the cross-coupled amplifier and configured to receive a decoder signal;
      a first transistor, comprising:
         a drain electrically coupled to an output of the word line driver; and
         a gate electrically coupled to the second node; and
      a second transistor, comprising:
         a drain electrically coupled to the output of the word line driver; and
         a gate electrically coupled to the at least one inverter, the gate of the first transistor and the gate of the second transistor are configured to receive two separate signals,
      wherein the word line driver is configured to generate a word line signal at the output of the word line driver based on the operating voltage signal and the decoder signal.

9. The semiconductor device of claim 8, wherein
   the first transistor further comprises:
      a source configured to receive the operating voltage signal; and
   the second transistor comprising further comprises:
      a source configured to receive a reference voltage.

10. The semiconductor device of claim 8, wherein the control switch is a p-type metal-oxide-semiconductor (PMOS) transistor.

11. The semiconductor device of claim 10, wherein a gate width of the control switch ranges from 0.26 microns to 0.35 microns.

12. The semiconductor device of claim 10, wherein a gate length of the control switch ranges from 0.13 microns to 0.17 microns.

13. The semiconductor device of claim 8, wherein the cross-coupled amplifier comprises:

a first n-type metal-oxide-semiconductor (NMOS) transistor; and a second NMOS transistor, wherein a gate width of the first and second NMOS transistors ranges from 3.7 microns to 4.5 microns.

14. The semiconductor device of claim 8, wherein if the operating voltage signal has a first voltage level the word line driver is in a write mode, and if the operating voltage signal has a second voltage level less than the first voltage level the word line driver is in a read mode.

15. The semiconductor device of claim 8, further comprising:

a controller configured to receive a read/write signal and output a selector signal based on the read/write signal.

16. The semiconductor device of claim 15, further comprising:

a switch configured to receive a first operating voltage and a second operating voltage less than the first operating voltage, wherein the switch is configured to output an operating voltage signal based on the selector signal.

17. A method comprising:

generating a word line signal, using a word line driver, based on a node voltage, a decoder signal, and an operating voltage, wherein generating the word line signal comprises:

causing a control switch to electrically connect a first node to a second node when the word line driver is in a write mode, the first node being configured to receive the operating voltage, and the second node having the node voltage; and causing the control switch to electrically disconnect the first node from the second node when the word line driver is in a read mode; and operating a memory array based on the word line signal.

18. The method of claim 17, wherein the operating voltage is determined based on a selector signal indicating either the read mode or the write mode, wherein, the operating voltage is set to a first voltage level if the selector signal indicates the read mode, and the operating voltage is set to a second voltage level different than the first voltage level if the selector signal indicates the write mode.

19. The method of claim 17, wherein determining the word line signal further comprises:

setting the word line signal equal to the operating voltage if the decoder signal is equal to a first logic state; and setting the word line signal equal to a reference voltage if the decoder signal is equal to a second logic state different than the first logic state.

20. The method of claim 17, further comprising:

supplying a control signal to the control switch, the control signal having a voltage level sufficiently high to maintain control of the control switch during an electrostatic discharge event.

21. The semiconductor device of claim 8, further comprising:

a memory array configured to receive the word line signal, wherein the memory array comprises at least one electronic fuse (eFuse) configured to be programmed based on the word line signal.

* * * * *